United States Patent [19]

Matsushita

[11] Patent Number: 5,256,592
[45] Date of Patent: Oct. 26, 1993

[54] METHOD FOR FABRICATING A SEMICONDUCTOR INTEGRATED CIRCUIT DEVICE

[75] Inventor: Ikuya Matsushita, Tokyo, Japan

[73] Assignee: Oki Electric Industry Co., Ltd., Tokyo, Japan

[21] Appl. No.: 927,726

[22] Filed: Aug. 11, 1992

Related U.S. Application Data

[63] Continuation of Ser. No. 720,503, Jun. 20, 1991, abandoned.

[30] Foreign Application Priority Data

Oct. 20, 1989 [JP] Japan .................................. 1-271453

[51] Int. Cl.⁵ .......................................... H01L 21/76
[52] U.S. Cl. .................................... 437/67; 437/65
[58] Field of Search .................................... 437/65, 67; 148/DIG. 85, DIG. 86, DIG. 50, DIG. 35

[56] References Cited

U.S. PATENT DOCUMENTS

| | | | |
|---|---|---|---|
| 4,505,025 | 3/1985 | Kurosawa et al. | 29/576 |
| 4,868,136 | 9/1989 | Ravaglia | 437/67 |
| 5,009,703 | 4/1991 | Zdebel et al. | 437/72 |

FOREIGN PATENT DOCUMENTS

| | | | |
|---|---|---|---|
| 104765 | 4/1984 | European Pat. Off. | 437/67 |
| 58-71638 | 4/1983 | Japan | 437/67 |
| 58-210634 | 12/1983 | Japan . | |
| 59-219938 | 12/1984 | Japan | 437/67 |
| 60-149149 | 8/1985 | Japan | 437/67 |
| 60-241231 | 11/1985 | Japan . | |
| 62-296456 | 12/1987 | Japan | 437/67 |
| 63-114130 | 5/1988 | Japan | 437/67 |
| 63-122239 | 5/1988 | Japan | 437/67 |
| 110727 | 4/1989 | Japan | 437/67 |

*Primary Examiner*—George Fourson
*Attorney, Agent, or Firm*—Wenderoth, Lind & Ponack

[57] ABSTRACT

A method of the invention comprises the step of forming on part of a silicon substrate (101) a three-layered film consisting of a first silicon nitride film (102), a first silicon oxide film (103) and a second silicon nitride film (104) and forming a third silicon nitride film (106) on side wall portions of the three-layered film, the step of etchiing an exposed silicon substrate (101) to form a first groove having substantially vertical side walls and refilling the first groove with a silicon oxide film (108), and the step of removing the second and third silicon nitride films (104,106) to form a second groove (111) having substantially vertical side walls relative to the silicon substrate (101) exposed by the removal. Accordingly, the second groove (111) which serves as a trench groove by self alignment is formed an end portion of the silicon oxide film (108) within a field region (107) as having a structure which is in direct contact with an element forming region (115). In addition, the groove width is constant as a width of the third silicon nitride film (106), thus permitting the parasitic capacitance between the collector and the substrate to be minimized.

2 Claims, 5 Drawing Sheets

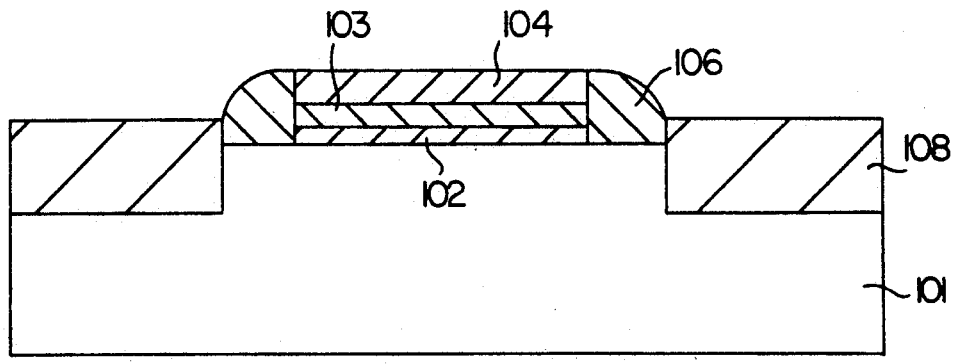
F I G. 1D
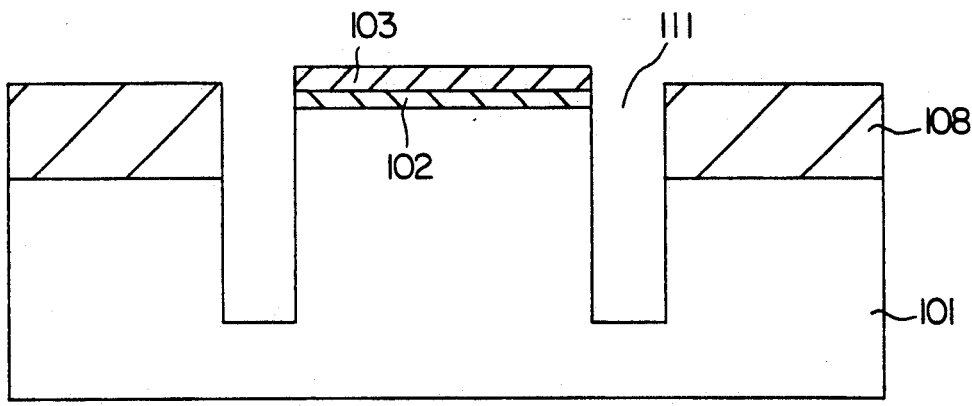
F I G. 1E
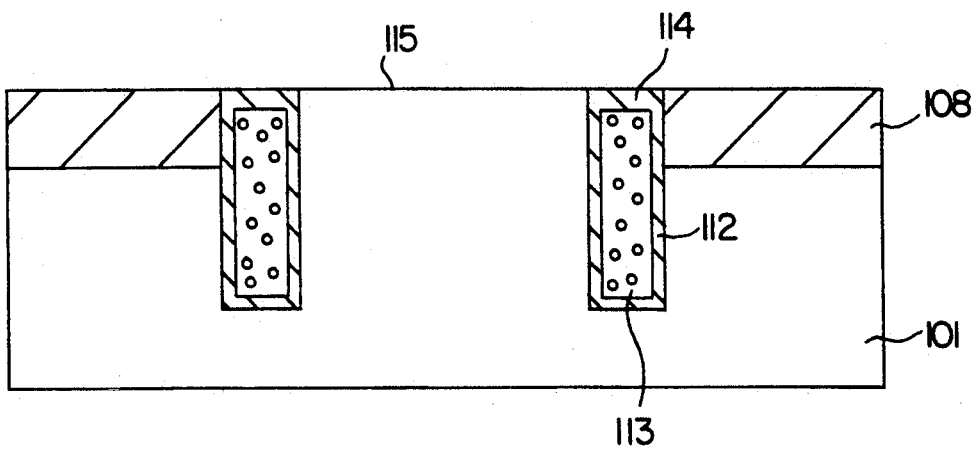
F I G. 1F

METHOD FOR FABRICATING A SEMICONDUCTOR INTEGRATED CIRCUIT DEVICE

This application is a continuation of now abandoned application, Ser. No. 07/720,503 filed on Jun. 20, 1991 which in turn is based upon International application No. PCT/JP90/01321, filed Oct. 12, 1990.

TECHNICAL FIELD

This invention relates to a method for fabricating a semiconductor integrated circuit device having a structure wherein a U-shaped trench groove is self-alignedly formed at an end portion of a silicon oxide within a field region for direct contact with an element forming region.

TECHNICAL BACKGROUND

The element separation of semiconductor integrated circuit devices has hitherto relied on a PN junction separation technique. As the element has been made finer with an increasing degree of integration, the technique has been changed to a oxide film separation technique (so-called iso-planer).

In recent years, however, since the fineness of the element further proceeds, there arises the necessity of reducing and area of the separation region to meet a high degree of integation. For meeting a high speed requirement, reduction of parasitic capacitance is necessary, thus making it essential to reduce an area in the element forming region.

Recently, there has been used a reactive ion etching (hereinafter referred to simply as R.I.E.) technique which is anisotropic etching technique of etching a film vertically with respect to a substrate surface. Thus, a new element separation technique has now been developed in place of the oxide film separation method.

Among hitherto proposed, new separation techniques, a technique to which attention has been paid and which has been attemped to be put in practice is a trench separation technique.

Specific examples of the trench separation technique include, for example, those set forth by H. Goto et al "A new isolation technology for bipolar VLSI logic (IOPL)" 1985 VLSI Symposium, pp. 42-43, and Japanese Laid-open Patent Application Nos. 59-208744 and 61-264736.

Fundamental steps of the trench separation technique used in a known method of fabricating a semiconductor, integrated circuit device are described with reference to the step illustrative views shown in FIG. 2.

As shown in FIG. 2(A), a field silicon oxide film 202 is formed on an arbitrary region of a silicon substrate 201 according to a known selective oxidation method (LOCOS method).

Thereafter, according to the CVD method, a mask silicon oxide film 203 is formed, followed by forming an opening 205 at a region which serves as an element separation region, through a photoresist 204 by the use of a known photolithographic technique.

Subsequently, as shown in FIG. 2(B), the photoresist 204 is removed, after which the sillicon substrate 201 is substantially vertically etched through a mask of the mask silicon oxide film 203 according to R.I.E. to form grooves 206.

After removal of the mask silicon oxide film 203, an inner wall silicon oxide film 207 is formed on the entire surface according to a thermal oxidation method or the CVD method as shown in FIG. 2(C).

If necessary, the inner wall silicon oxide film 207 may be provided thereon with a oxidation-resestant silicon nitride film.

As shown in FIG. 2(D), a thick polysilicon 208 is deposited over the entire surface to completely fill up the grooves 206 therewith.

Finally, as shown in FIG. 2(E), the polysilicon layer 208 is etched back and planarized on the surface thereof. Thereafter, the polysilicon 208 is converted to a CAP silicon oxide film 209 on the surface thereof. The inner wall silicon oxide film 207 is removed from an element forming region 210 to complete the separation procedure.

In FIG. 4, there are shown sectional views after completion of the separation steps of the oxide film separation method and the trench separation method, respectively.

FIG. 4(A) is a sectional view showing the separation with an oxide film, in which indicated at 401 is a field oxide film, at 402 is an element forming region, at 403 is an N+ diffusion layer, at 404 is a P+ diffusion layer and at 405 is a substrate.

FIG. 4(B) shows the separation by the trench separation method wherein indicated at 406 is a field oxide film, at 407 an element forming region, at 408 is an N+ diffusion layer, at 409 is a P+ diffusion layer, at 410 is a substrate and at 411 is a trench.

In the oxide film separation method shown in FIG. 4(A), the N+ diffusion layer 403 serving for diffusion by burying and the P+ diffusion layer 404 serving as a channel stopper are directly contacted with each other, so that the junction capacitance therebetween becomes great. On the contrary, in the trench separation method shown in FIG. 4(B), the trench 411 is formed substantially in a vertical direction relative to the silicon substrate 410 by R.I.E. in such a way that it passes from the field oxide film 406 through the N+ buried diffusion layer to a deep region.

More particularly, the N+ diffusion layer 408 and the P+ diffusion layer 409 are not directly contacted.

Accordingly, the junction capacitance which is taken into account is only one between the N+ diffusion layer 408 serving as a buried diffusion layer and the substrate 410.

When comparing with the oxide film separation method, the capacitance lowers remarkably. This will result in a drastic improvement in the high speed performance.

· According to the above method, such a structure is obtained wherein part of the field silicon oxide film 302 is sandwiched between the element forming region 301 and the trench 303 as shown in FIG. 3(A).

For further high speed performance, the reduction in capacitance between the collector-substrate will become more important. It is considered ideal to provide a structure, as shown in FIG. 3(B), wherein the element forming region 301 and the trench 303 are in direct contact with each other.

However, the position of the trench 303 is determined by mask alignment and consideration should be given to any shift in the mask alignment, forcing the structure shown in FIG. 3(A). More particularly, if the mask alignment is not allowed but where shifted, the silicon surface is exposed aside from the element forming region 301 as shown in FIG. 3(C), with an attendant problem that short circuiting between the wiring metal layer and the substrate takes place.

If the field silicon oxide film 302 and the trench 303 are formed in an order reverse to currently employed order, the structure of FIG. 3(B) may be formed. In this case, oxidation will proceed in a vertical direction along the side wall oxide film which is formed at the side wall of the trench 303, thus presenting the problem of causing crystal defects to be produced owing to an increase of the volume.

The present invention provides a method for fabricating a semiconductor integrated circuit device which can solve, among the prior art problems, the problem of the short circuiting between the wiring metal layer and the substrate and the problem of producing crystal defects owing to an increase of the volume.

DISCLOSURE OF THE INVENTION

According to the invention, there is provided a method which comprises the step of forming on part of a silicon substrate a three-layered film consisting of a first silicon nitride film, a first silicon oxide film and a second silicon nitride film and forming a third silicon nitride film on side wall portions of the three-layered film, the step of etching an exposed silicon substrate to form a first groove having substantially vertical side walls and refilling the first groove with a silicon oxide film, and the step of removing the second and third silicon nitride films to form a second groove having substantially vertical side walls relative to the sillicon substrate exposed by the removal.

By the above arrangement, the second groove which serves as a trench groove is self-alignedly formed at an end portion of the silicon oxide film within the field region and has such a structure of directly contacting an element forming region. In addition, the width of the groove is made constant at a width of the third silicon nitride film, thus minimizing the parasitic capacitance between the collector-substrate.

BRIEF DESCRIPTION OF THE DRAWINGS

FIGS. 1(A) to 1(F) are sectional view of steps of a semiconductor integrated circuit device according to one embodiment of the invention;

BEST MODE FOR CARRYING OUT THE INVENTION

An embodiment of a method for fabricating a semiconductor integrated circuit device according to the invention is described with reference to the accompanying drawings. FIG. 1(A) to 1(F) are illustrative views of the embodiment.

Figure 1A:
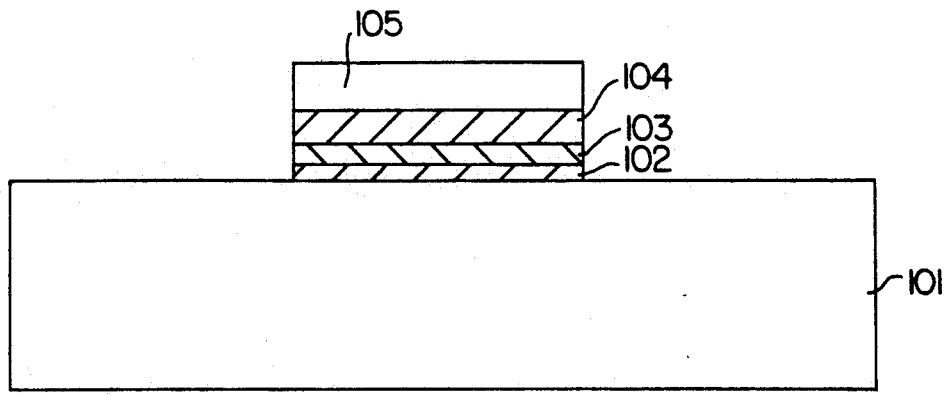

As shown in FIG. 1(A), an about 0.2–0.3 μm thick silicon nitride film 102 is formed on an entire surface of a silicon substrate 101 according to the CVD method, followed by further formation of an about 0.3–0.5 μm thick silicon oxide film 103 by the CVD method.

Moreover, according to the CVD method, an about 0.5–0.8 μm thick silicon nitride film 104 is formed, on which a photoresist 105 is applied.

Next, using a known photolithographic technique, openings are formed in the silicon nitride film 104, the silicon oxide film 103 and the silicon nitride film 102 at a region which serves as a field region, through a mask of the photoresist 105.

At the time, the silicon nitride film 104, the silicon oxide film 103 and the silicon nitride film 102 are each anisotropically etched to make substantially vertical side walls thereof.

Figure 1B:
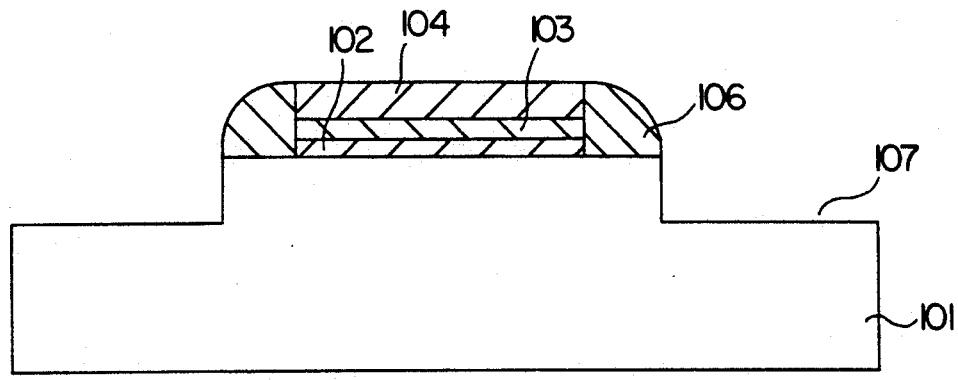

Subsequently, as shown in FIG. 1(B), after removal of the photoresist 105, a silicon nitride film 106 is formed over an entire surface in a thickness substantially the same as the total thickness of the silicon nitride film 104, the silicon oxide film 103 and the silicon nitride film 102 (i.e. 1.0–1.6 μm).

Thereafter, using a known etching technique, the silicon nitride film 106 is anisotropically etched, thereby leaving the silicon nitride film 106 only on side walls of the film consisting of three layers of the silicon nitride film 102, the silicon oxide film 103 and the silicon nitride film 104.

The width of the thus left silicon nitride film 106 is equal to and the same as a width of a trench groove formed in a subsequent step.

Subsequently, the exposed openings of the silicon substrate 101 are subjected to anisotropic etching to a depth of about 1.0 μm through the silicon nitride films 104 and 106 by the use of a known anisotropic etching technique to form a first groove, thereby determining a field region 107.

Figure 1C:
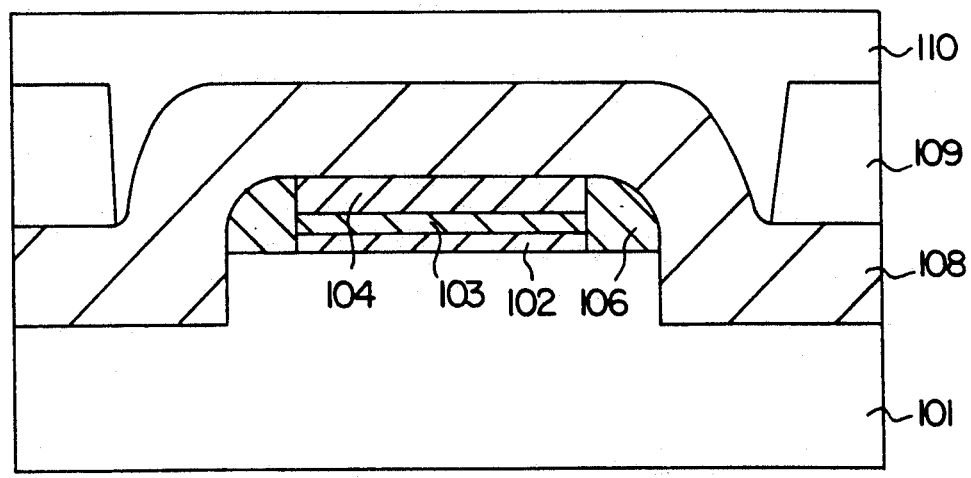
Figure 2A:
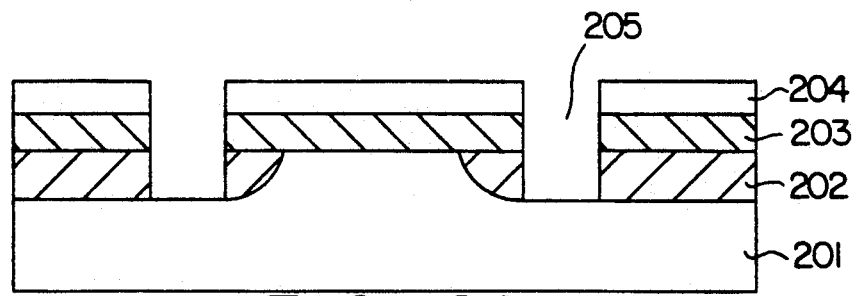
FIG. 2(A) to 2(E) are sectional views of steps showing fundamental steps of a trench separation procedure in a known method of fabricating a semiconductor integrated circuit device.
Figure 2B:
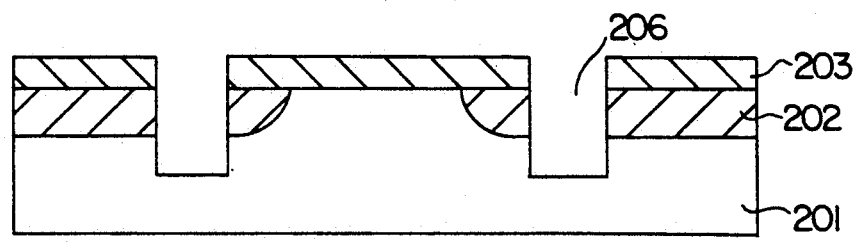
Figure 2C:
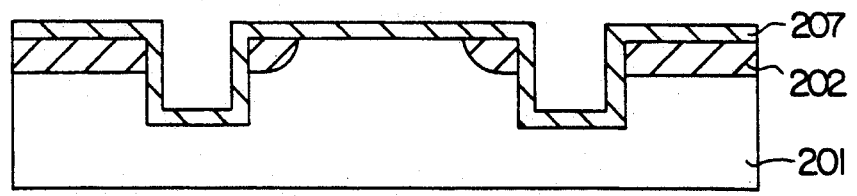
Figure 2D:
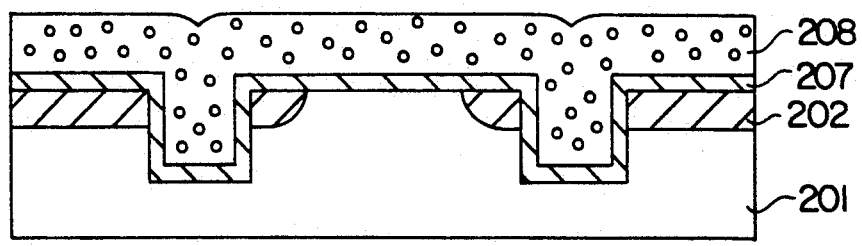
Figure 2E:
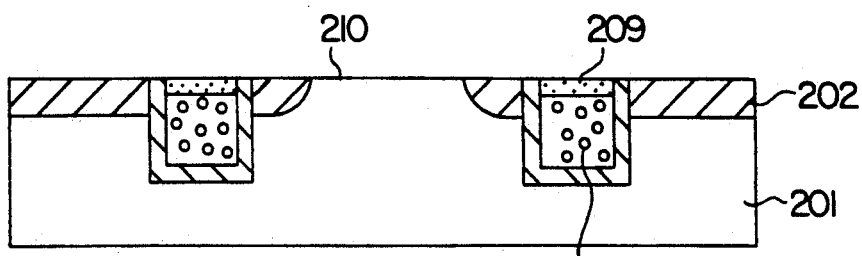
Figure 3A:
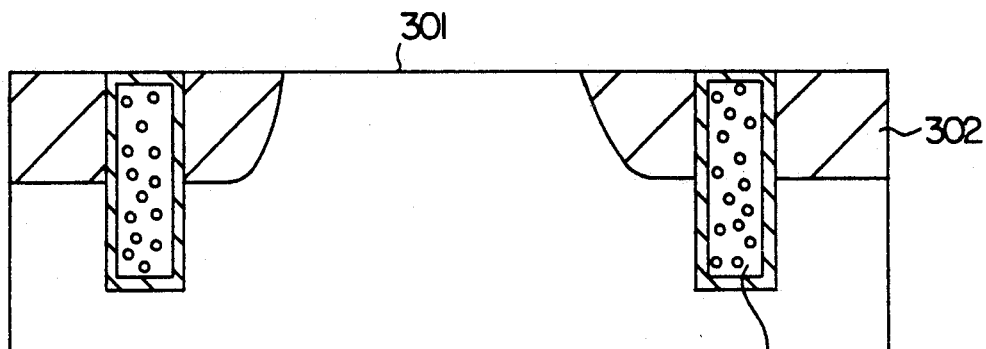
FIGS. 3(A) to 3(C) are sectional views for illustrating the problems involved in a known trench separation method.
Figure 3B:
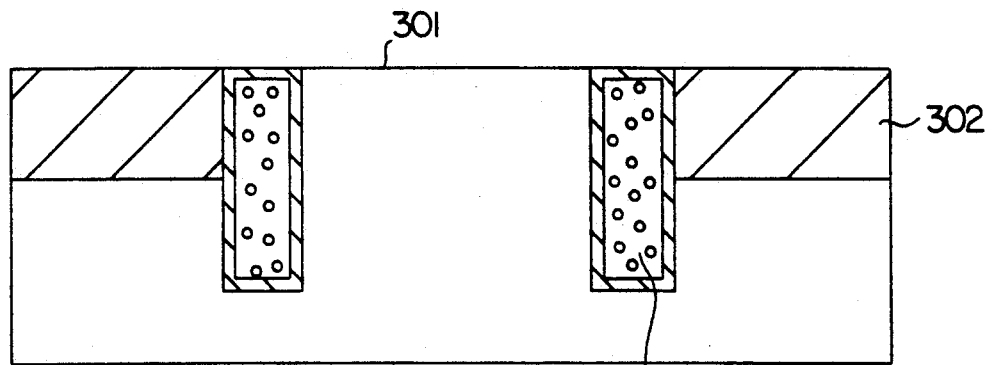
Figure 3C:
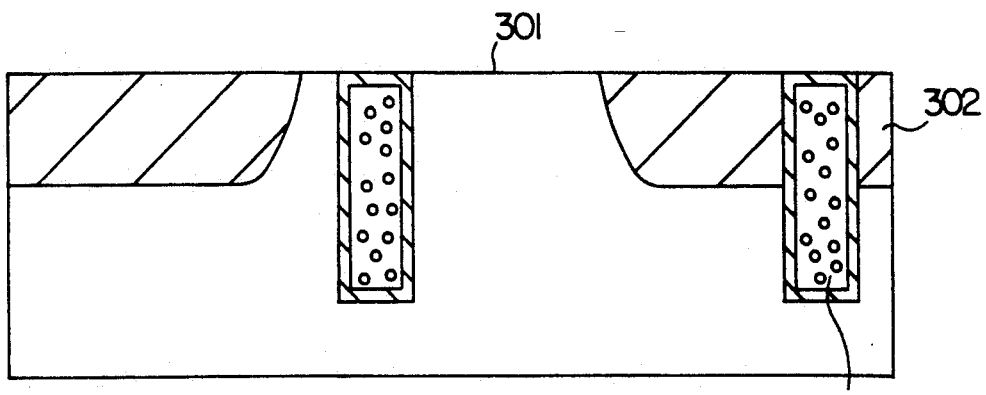
Figure 4A:
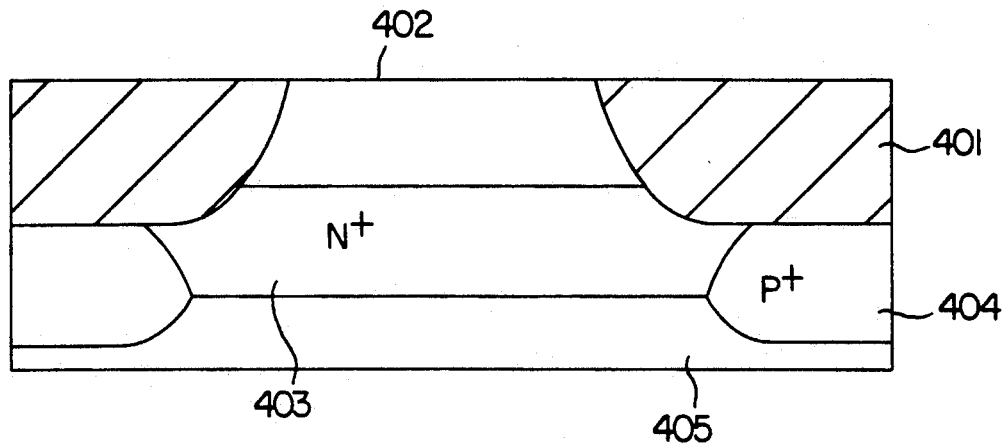
FIG. 4(A) is a sectional view after completion of a separation step in a known oxide film separation method and FIG. 4(B) is a sectional view after completion of a separation step in a known trench separation method.
Figure 4B:
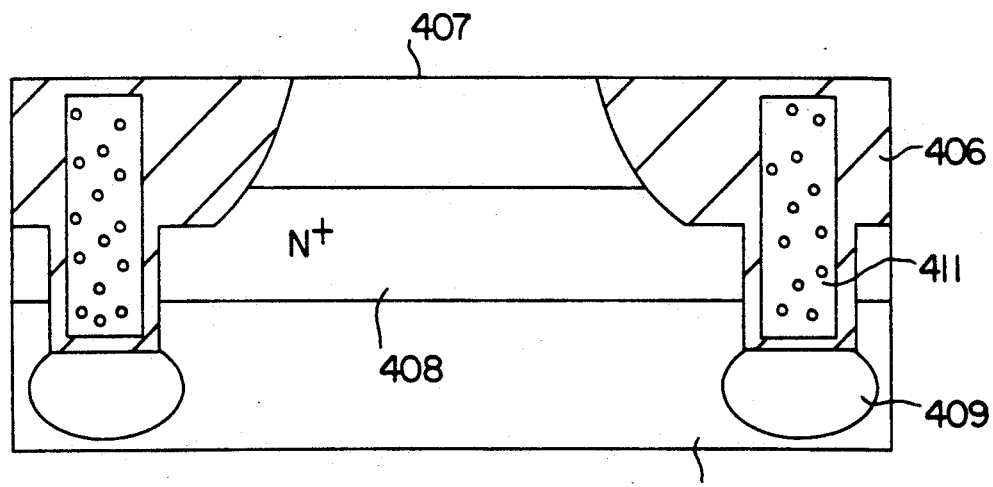

Then, as shown in FIG. 1(C), a silicon oxide film 108 is formed by a CVD method to again fill up the field region 107 therewith. The thickness of the silicon oxide film 108 preferably ranges 1.3–1.5 μm which is obtained by adding the thickness of the silicon oxide film 103 to an amount of the etched silicon substrate 101.

Using a known photolithographic technique, a photoresist 109 is formed as a planarizing dummy pattern on a lower portion of the stepped silicon oxide film 108. It will be noted that for the mask alignment in this step, strict accuracy is not necessary.

A photoresist 110 is then applied on the entire surface to make a flat surface.

As shown in FIG. 1(D), etching back is performed using a known equal speed etching technique wherein the etching selection ratio between the photoresists 110 and 109 and the silicon oxide film 108 is 1. The etching is terminated at the time when the photoresists 110 and 109 are completely removed. It will be noted that the etching may be isotropic in nature.

Thereafter, as shown in FIG. 1(E), the silicon nitride films 104 and 106 are all removed.

Subsequently, the exposed silicon substrate 101 is subjected to anisotropic etching through the masks of the silicon oxide films 103 and 108, thereby forming a groove 111 as a second groove which has a depth of about 2–4 μm and whose side walls are substantially vertical.

As shown in FIG. 1(F), a silicon oxide film 112 is formed over the entire surface including the inner walls of the groove 111 according to the CVD method, followed by deposition of a thick polysilicon layer 113 over the entire surface by the CVD method to completely refill the groove 111. Subsequently, according to a known etching technique, the polysilicon 113 is etched back, followed by removal of the silicon oxide films 112 and 103 by a known anisotropic etching technique to make a flat surface. Thereafter, the polysilicon layer 113 is converted into a silicon oxide film 114 on the surface thereof through a mask of the silicon nitride film 102. The silicon nitride film 102 used as the mask and left on an element forming region 115 is removed to provide a structure which has a flat surface and wherein the element forming region 115 and the ideal U-shaped groove 111 are in contact.

INDUSTRIAL UTILIZATION

According to the invention, a three-layered film consisting of a silicon nitride film, a silicon oxide film and a silicon nitride film is formed on an arbitrary region of a silicon substrate. A silicon nitride film is formed on side walls of the three-layered film and the silicon substrate is anisotropically etched and refilled with a silicon oxide film. The silicon nitride is removed and a groove is formed as an opening of the groove by anisotropic etching of the silicon, so that a U-shaped trench groove is self-alignedly formed at an end portion of the silicon oxide in the field region, making it possible to provide a structure in direct contact with the element forming region. In addition, the width of the groove is made constant at a width of the silicon nitride film formed at the side walls of the three-layered film.

Accordingly, the parasitic capacitance between the collector-substrate is in a minimum, so that a good high speed performance is ensured and a trench separation structure, which has a given width of an element forming region and a given width of the groove both of which contribute to improve a degree of integration, can be reproducibly obtained.

I claim:

1. A method for fabricating a semiconductor integrated circuit device comprising
   (a) the step of forming, on an element forming region on a surface of a silicon substrate, a three-layered film comprising of a first silicon nitride film, a first silicon oxide film and a second silicon nitride film;
   (b) the step of forming a third silicon nitride film on side walls of the three-layered film;
   (c) the step of anisotropically etching an exposed silicon substrate through the second and third silicon nitride films as a mask to form a first groove having substantially vertical side walls with respect to the semiconductor substrate and refilling the first groove with a second silicon oxide film; and
   (d) the step of removing the second and third silicon nitride films and forming a second groove having side walls substantially vertical with respect to the semiconductor substrate exposed by the removal of the third silicon nitride film by anisotropic etching through the first and second silicon oxide films as a mask.

2. A method for fabricating a semiconductor integrated circuit device comprising
   (a) the step of forming, on an element forming region on a surface of a silicon substrate, a three-layered film comprising a first silicon nitride film, a first silicon oxide film and a second silicon nitride film;
   (b) the step of forming a third silicon nitride film on side walls of the three-layered film;
   (c) the step of anisotropically etching an exposed silicon substrate through the second and third silicon nitride films as a mask to form a first groove having substantially vertical side walls with respect to the semiconductor substrate and refilling the first groove with a second silicon oxide film;
   (d) the step of removing the second and third silicon nitride films and forming a second groove having side walls substantially vertical with respect to the semiconductor substrate exposed by the removal of the third silicon nitride film by anisotropic etching through the first and second silicon oxide films as a mask;
   (e) the step of forming a third silicon oxide film on the second groove;
   (f) the step of forming a polysilicon layer on the third silicon oxide film; and
   (g) the step of converting an upper surface of the polysilicon layer into a fourth silicon oxide film through a mask of the second silicon nitride layer.

* * * * *